United States Patent [19]

Copeland, III et al.

[11] 4,152,713
[45] May 1, 1979

[54] UNIDIRECTIONAL OPTICAL DEVICE AND REGENERATOR

[75] Inventors: John A. Copeland, III, Fair Haven; Andrew G. Dentai, Highlands; Tien P. Lee, Holmdel, all of N.J.

[73] Assignee: Bell Telephone Laboratories, Incorporated, Murray Hill, N.J.

[21] Appl. No.: 857,369

[22] Filed: Dec. 5, 1977

[51] Int. Cl.² ............................................. H01L 31/12
[52] U.S. Cl. .......................... 357/19; 357/17; 357/55; 357/38; 350/96.1; 350/96.11
[58] Field of Search ............... 357/17, 18, 19, 55, 357/38; 250/551; 350/96.10, 96.11, 96.13, 96.14

[56] References Cited

U.S. PATENT DOCUMENTS

| | | | |
|---|---|---|---|
| 3,852,798 | 12/1974 | Lebaill | 357/19 |
| 3,936,855 | 2/1976 | Goell | 357/17 |
| 3,968,564 | 7/1976 | Springthorpe | 29/580 |
| 3,979,587 | 9/1976 | Le Gremerex | 250/211 J |
| 4,065,729 | 12/1977 | Gover et al. | 331/94.5 H |

Primary Examiner—Martin H. Edlow
Attorney, Agent, or Firm—Daniel D. Dubosky

[57] ABSTRACT

A light-activated light-emitting device has at least one p-n junction provided with electrodes for confining light-emission to an area of the junction. It has been determined that light-emission can be activated by light impinging on the junction outside this confined area, so two optical fibers are provided, one being an input fiber for bringing activating light to the nonemitting sensitive part of the junction and the other fiber being an output fiber coupled to the light-emitting area. When the device is a p-n-p-n light-activated light-emitting switch provided with an RCL reset control circuit, a very inexpensive unidirectional optical pulse regenerator is obtained. The device in its various forms is advantageously suited for use in each of many stations along optical fiber data busses or in optical logic arrays because the unidirectional feature prevents light feedback between adjacent devices and consequently avoids spurious switching of a preceding device.

12 Claims, 9 Drawing Figures

UNIDIRECTIONAL OPTICAL SWITCH

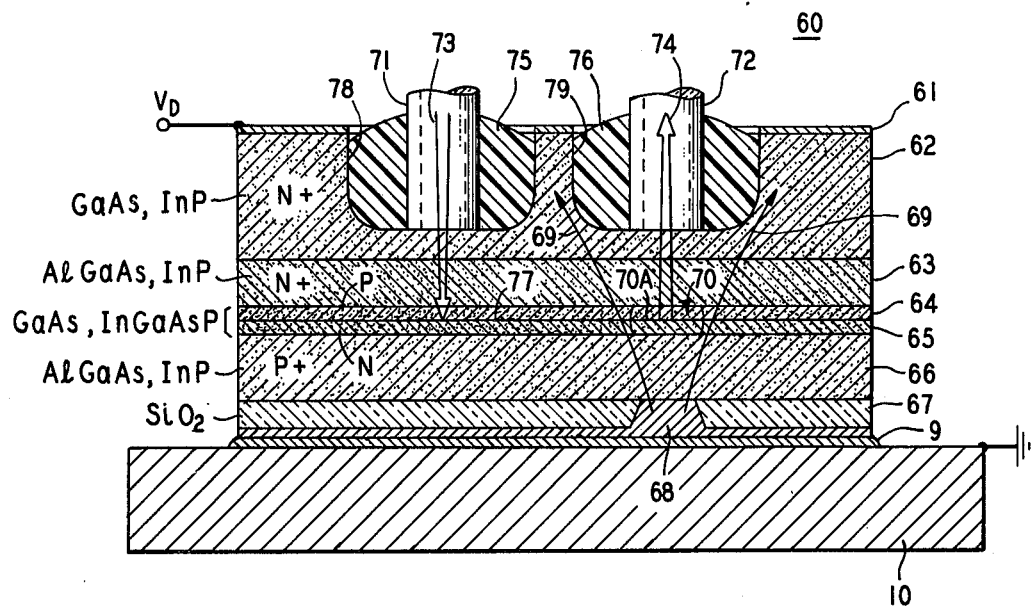

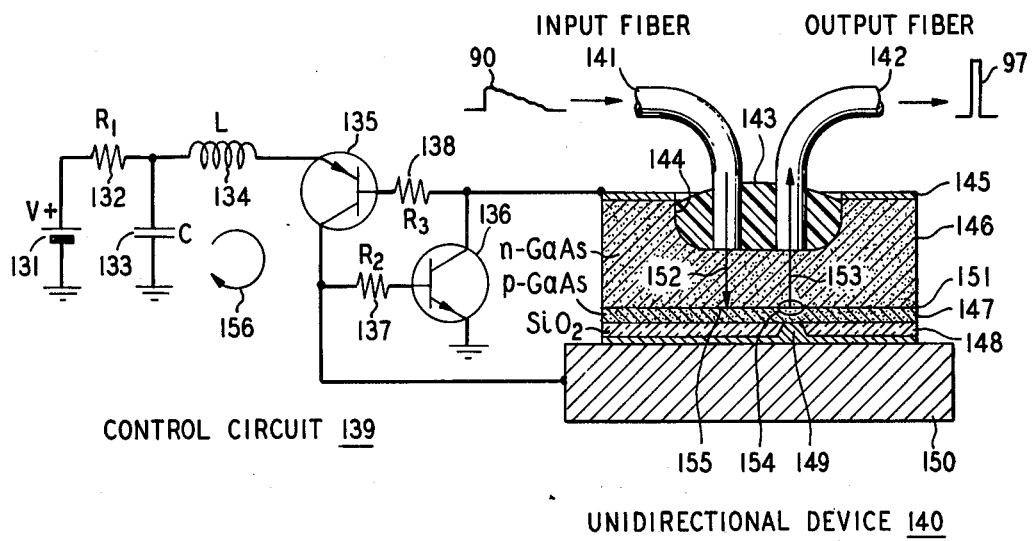

UNIDIRECTIONAL OPTICAL DEVICE AND REGENERATOR

BACKGROUND OF THE INVENTION

The present invention relates to light-activated light-emitting devices, and optical amplifiers and regenerators utilizing such devices.

The use of electricity and microwaves for carrying communications is well-known. In recent years, it has been suggested that messages be carried in optical fiber waveguides forming part of communication systems which feature advantageously wide bandwidth, substantial freedom from electromagnetic interference, and attractive cost. In some such systems light-emitting diodes convert electrical information into light signals, and the optical fibers carry the light to its destination. A photodetector receives and converts the light signals to electrical form at the destination.

In more complex systems the electrical signal derived from the photodetector is then amplified by means of electronic apparatus and applied to another light-emitting diode and optical fiber, thus extending the distance over which optical communication can be performed. The photodetector, electronic amplifier and light-emitting diode form an optical repeater.

When the design of the system is such that communications or digital logic information is sent over each optical fiber in the form of short pulses, the pulses are not only reduced in strength on their way, thus requiring amplification, but also are disadvantageously broadened in time by a phenomenon known as optical dispersion which results from the components of the light signal travelling at different velocities. This objectionable pulse broadening has been heretofore eliminated in an optical repeater by providing an electronic pulse regenerator circuit as part of the electronic apparatus between the photodetector and light-emitting diode of the repeater.

Unfortunately, optical communications systems utilizing such prior art repeaters and regenerators can involve substantial expense and consequently in many applications can have difficulty in economically competing with coaxial cable and other electrical transmission systems.

SUMMARY OF THE INVENTION

Apparatus constructed in accordance with the present invention can regenerate a weak input pulse without the use of an electronic pulse regenerator circuit of the type utilized in the prior art.

In the present invention, it is recognized that a single p-n semiconductor junction can produce electrical currents when reverse-biased and provided with radiation in the infrared, visible, and/or ultraviolet regions of the light spectrum. Also, a p-n junction can emit light in this spectrum when forward-biased. Moreover, it is recognized that when an electrode structure capable of confining a light-emitting volume of the device is provided to a p-n junction device, the light sensitive portion of the p-n junction under reverse bias can be much larger in area than the portion or area of the same junction included in the light-emitting volume of the device under forward bias. The invention utilizes these principles so that light impinging upon the junction in reverse bias substantially outside the light-emitting area triggers or activates the device to emit light from the relatively smaller light-emitting area or portion of the same junction. The means for coupling the activating light to the junction substantially outside the light-emissive portion is directionally sensitive to incoming light and therefore only a relatively minor proportion of the amplified or regenerated light from the emission volume is coupled back into the coupling means. In the preferred embodiment this coupling means is an optical fiber mounted with its axis perpendicular to the junction. Thus, the invention is rendered optically unidirectional, an important advantage when a plurality of such devices are contemplated for use in optical communication system applications.

Inexpensive electrical control or reset circuitry is advantageously and synergistically combined according to the invention with the unidirectional p-n junction device so as to appropriately control the electrical biasing of the device over time in a manner suitable to the light amplification or regeneration purpose at hand. Additional coupling means such as a second optical fiber is coupled to the confined light-emitting volume.

BRIEF DESCRIPTION OF THE DRAWINGS

FIG. 6 shows a 200× magnified cross-sectional front view of a unidirectional optical device according to the invention having a multiple optical fiber well construction. As in FIG. 1 the magnification is about 20 times greater in the vertical direction for clarity.

FIG. 7 shows a partially pictorial, partially schematic diagram of an optical pulse regenerator apparatus using any one of the devices of FIGS. 1, 4, 5 and 6 in synergistic combination with electrical reset control circuitry.

FIG. 9 shows a partially cross-sectional, partially schematic diagram of an optical regenerator according to the invention utilizing a unidirectional device of the invention having a single p-n junction with an associated control circuit in synergistic combination therewith.

DETAILED DESCRIPTION OF THE DRAWING

Figure 1:
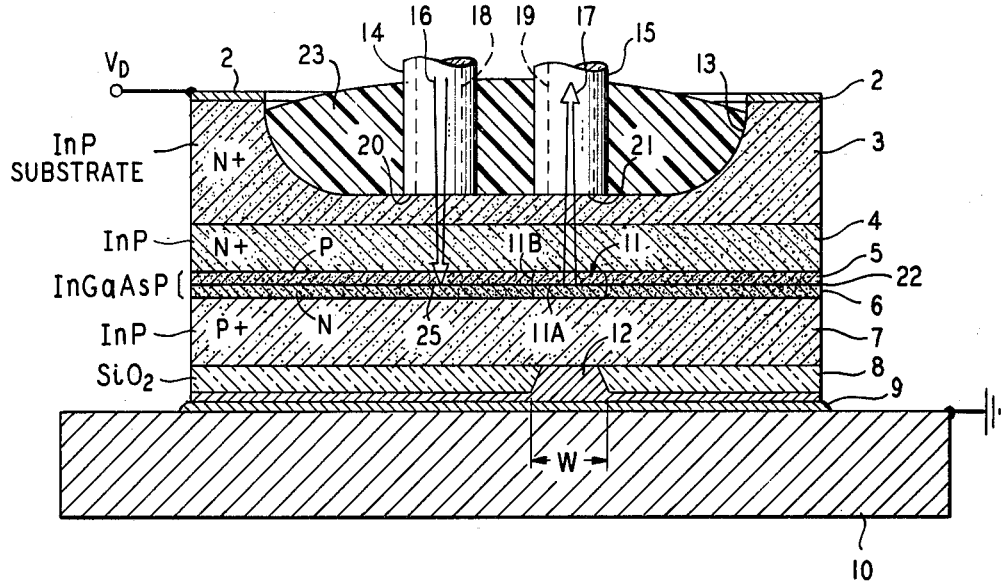
FIG. 1 shows a 200× magnified cross-sectional front view of a unidirectional optical switch according to the invention being disproportionately enlarged in the vertical direction by a relative factor of 20 for clarity.

In FIG. 1 unidirectional optical switch device 1 is energized at gold electrode 2 by a negative voltage source V- and current limiting series resistor R (not shown) producing negative device voltage $V_D$ on electrode 2 with respect to a grounded metal heat sink 10.

Device 1 is a p-n-p-n light-emitting diode switch having a light sensitive middle p-n junction 22 in the indium gallium arsenide phosphide (InGaAsP). Activating light energy, designated as ray 16 in FIG. 1 is carried in core 18 of an input optical fiber 14. Fiber 14 is embedded by an epoxy glue 23 in well 13 of an indium phosphide (InP) substrate 3. Fiber 14 is positioned such that its end 20 couples the light in ray 16 through InP substrate 3, through an indium phosphide buffer layer 4, and through a p-type InGaAsP layer 5 to a nonemissive sensitive area 25 of junction 22 which lies outside of light-emitting area 11A in the junction plane. Incoming light 16 suitably has a wavelength shorter than or equal to (and therefore energy greater than or equal) to the wavelength corresponding to the bandgap of the InGaAsP, thereby causing the generation of photocarriers suitable for triggering the switch 1 on. Thus, light-activated photoswitching of the p-n-p-n device 1 occurs by the injection of carriers in a location laterally displaced from the ultimate zone of light emission.

When triggering of the device 1 occurs, p-n junction 22 changes from a reverse-biased high impedance condition to a forward-biased low impedance condition. A substantially increased current flows from dot contact 12 through the semiconductor layers 7, 6, 5, 4 and 3 to electrode 2. Because of the ohmic voltage drop in the semiconductor and the small width W, suitably 50 microns, of contact 12 surrounded by silica ($SiO_2$) insulation of layer 8, light emission is confined to only a relatively small volume 11 between N+ and P+ indium phosphide layers 4 and 7 in the InGaAsP layers 5 and 6. Moreover, light-emitting volume 11 only includes a small 50 micron diameter portion or area 11A of p-n junction 22.

The electrical energy supplied to device 1 is converted into light energy designated by ray 17 in FIG. 1 which largely passes from volume 11, through InP buffer layer 4 and InP substrate 3, through end 21 of an output fiber 15 into its waveguiding core 19. An essentially negligible amount of light from light-emitting volume 11 is coupled back into fiber 14 because light-emitting volume 11 is substantially outside of the receptive aperture of fiber 14. Fiber 15, on the other hand, carries away a substantial proportion of the light emitted from volume 11, thus rendering device 1 substantially unidirectional in that light ray 16 is amplified to become light ray 17, but not vice versa. Since both fibers 14 and 15 have their axes perpendicular to the plane of junction 22, they may be fastened by epoxy 23 to well 13 simultaneously, and heat-sinking of device 1 is readily accomplished on the opposite side through an indium (In) solder layer 9.

Figure 2:
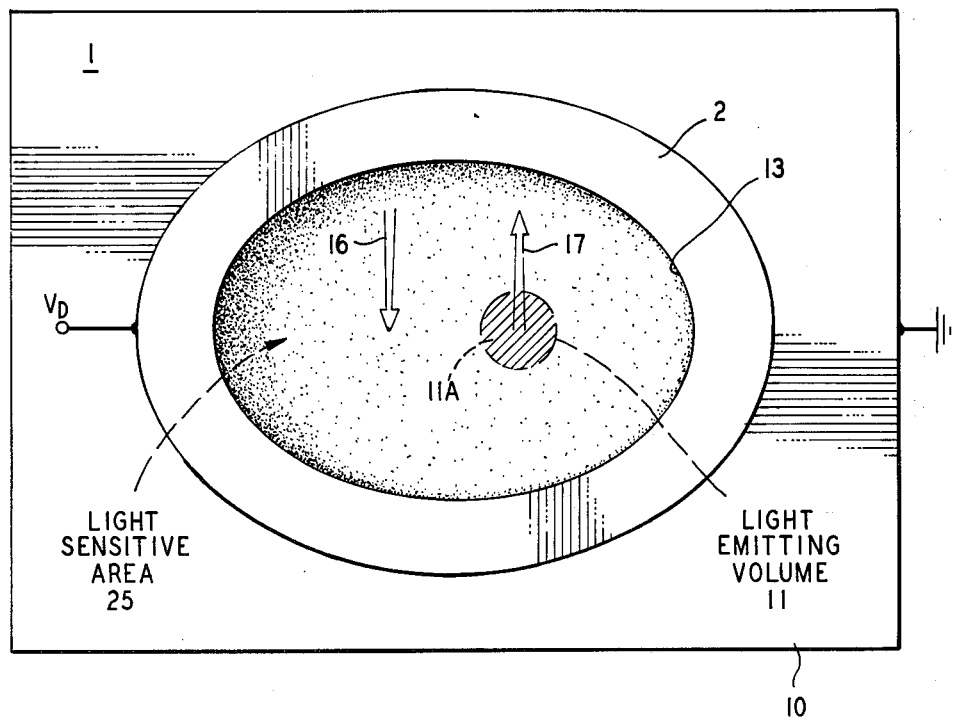
FIG. 2 shows a plan view of the unidirectional optical switch of FIG. 1.

FIG. 2 shows device 1 from above. Light-emitting volume 11 as seen from above substantially coincides in size with circular area 11A of junction 22. Light 16 may be alternatively coupled by suitable means such as a lens instead of optical fiber 14 into the sensitive area 25 of junction 22 outside of the light-emitting area 11A. It is to be understood that light-emitting area 11A under reverse biased conditions is light sensitive, but coupling light thereto is not advantageous for unidirectional operation, so means of coupling to junction 22 in the region 25 substantially outside the light-emitting area 11A is required.

Fabricational details of the layers in FIG. 1 are provided hereinafter. The device 1 is grown by a standard liquid phase epitaxial (LPE) growth technique utilizing a horizontal sliding graphite boat assembly with successive melts. A description of a LPE procedure utilized in fabricating InGaAsP light-emitting diodes is described in substantial detail in "Small-Area, High-Radiance C. W. InGaAsP LEDs Emitting at 1.2 to 1.3 $\mu$m", by A. G. Dentai, T. P. Lee and C. A. Burrus, Electronic Letters, Vol. 13, No. 16, Aug. 4, 1977, pp. 484–485. The device of FIG. 1 is improved over the light-emitting diodes described in that article by providing the offset input fiber 14 as well as the output fiber 15 in an enlarged circular, or preferably an elliptical or oval well 13, thereby achieving both a detector and an LED in the same device. Moreover, a p-n homojunction 22 is grown in the InGaAsP in the inventive embodiments of FIGS. 1, 4, 5 and 6 so as to provide a p-n-p-n switch structure integral to the device.

In an illustrative version of the device, [111] InP substrate 3 is heavily doped N+ with tin (Sn) to a carrier concentration of about $3 \times 10^{18}$. InP buffer layer 4 has a thickness suitably of 2.8 microns and is doped N+ with tin (Sn) to a carrier concentration of approximately $1 \times 10^{18}$. InGaAsP layers 5 and 6 have a combined thickness of 1.3 microns and p-layer 5 is doped with zinc to a carrier concentration of approximately $2 \times 10^{16}$. High quality liquid phase epitaxially grown InGaAsP results from growth in a 51 millimeter inside diameter tube in multiwell graphite boat technique, the boat wells having bottom dimensions 0.27 inches by 0.44 inches and 0.40 inches well depth. Growth temperatures are 635 degrees C. with a cooling rate of 0.4 degrees C. per minute to obtain a bandgap at 1.2 microns. The liquid composition of the InGaAsP melts on a per 1,000 milligrams of indium basis is 1,000 milligrams indium, 60.30 milligrams indium arsenide (InAs), 12.61 milligrams gallium arsenide (GaAs) and 9.7 milligrams indium phosphide (InP). On this basis 0.0005 ($5 \times 10^{-4}$) milligrams of zinc (Zn) are used to provide 0.0001 ($10^{-4}$) atomic percent zinc dopant for the p-InGaAsP melt. Since the zinc is volatile in the melt, the boat well containing it is preferably closed to prevent vapor transport and escape of zinc. Ten (10) milligrams of tin (Sn) are used in the n-InGaAsP melt for 1.0 atomic percent of this dopant in the melt. The resulting n-layer 6 is tin-doped to a carrier concentration of about $1 \times 10^{17}$ thereby to provide the p-n homojunction 22 between InGaAsP layers 5 and 6. While the location of the homojunction in the InGaAsP is not critical, calculations indicate that optimizing competing considerations of gain, electrical leakage, high punch-through voltage and degree of absorption of output light suggests utilizing a thickness of 1 micron for p-layer 5 and a thickness of 0.2 microns for n-layer 6. With optimization, the device 1 need not be operated near the switching threshold at the "knee" of the characteristic curve, thus eliminating the need for unduly elaborate bias-control circuitry in a commercially practical apparatus using the device. InP layer 7 has a thickness of 3.3 microns and is suitably doped P+ with zinc to a carrier concentration of $2 \times 10^{18}$. A silica layer 8 is deposited on InP layer 7 and a small dot contact 12 is provided through the silica layer 8 by standard technique. Contact 12 is attached to grounded heat sink 10 by means of indium solder 9.

Fibers 14 and 15 in a demonstration model of the invention are spaced parallel and glued to a small piece of square cover glass (not shown) to maintain their parallel separation during the epoxy operation. The fibers are cleaved so as to provide optically finished ends 20 and 21. The fibers have 60 micron outside diameters with 50 micron diameter cores 18, 19 having numerical aperture of 0.6. The glass holding the fibers is then placed in an xyz micropositioner under a microscope. Output from volume 11 into one of the fibers 15 is maximized as measured at an external photodetector at the other end of fiber 15. Since the diameter of area 11A is approximately 50 microns, in the model there is essentially no transmission of light into the other fiber 14 from the emitting area. The two fibers 14 and 15 are suitably bonded in place in well 13 with epoxy 23 to complete the fabrication.

Figure 3:
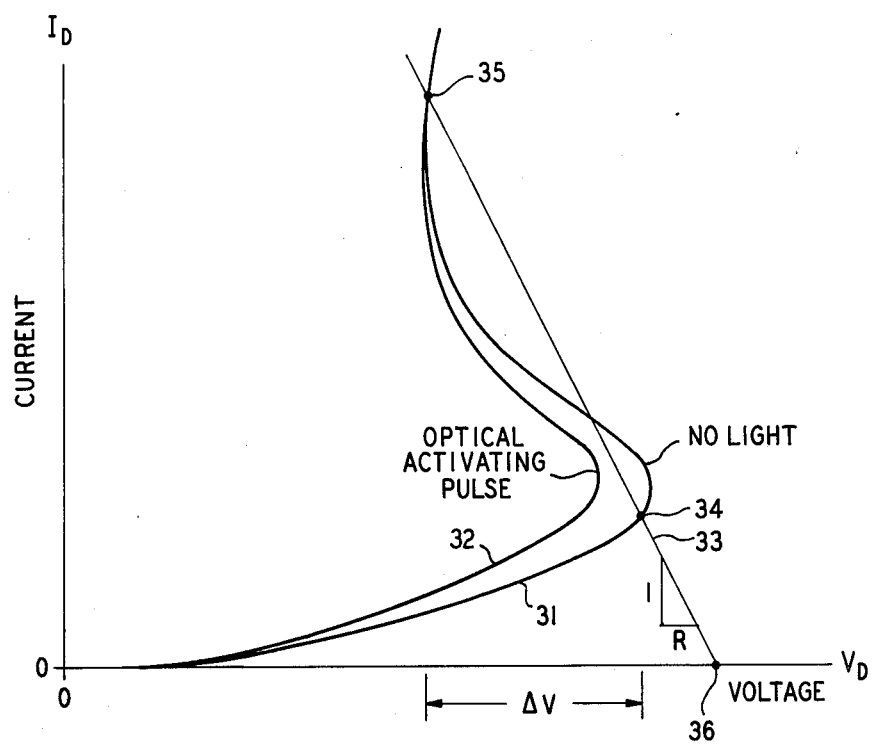
FIG. 3 shows electrical characteristic curves of current vs. voltage with and without activating light for the device of FIGS. 1 and 2.

In FIG. 3, two characteristic curves 31 and 32 of the p-n-p-n semiconductor device 1 of FIGS. 1 and 2 are shown. The ordinate $I_D$ represents the magnitude of current passing through the device and the abscissa $V_D$ represents the magnitude of voltage across the device between electrode 2 and heat sink 10 of FIG. 1. Curve 31 represents the S-shaped voltage-current device characteristic curve with no input light impinging upon p-n junction 22. An external circuit consisting of a battery having negative voltage V- represented by point 36 and a resistance represented by the inverse of the slope of load line 33 is seen to intersect characteristic curve 31 at point 34. This means that the circuit has a permissible operating point 34 at a high level of device voltage $V_D$ and a low level of device current $I_D$.

When an optical activating pulse of light 16 in FIG. 1 impinges upon junction 22, the characteristic curve of the device becomes displaced to a position shown by characteristic curve 32. The intersection of load line 33 and the characteristic curve 32 has only one intersection 35. This intersection represents a permissible circuit operating point at a lower device voltage $V_D$ and a much higher device current $I_D$. The result is that the device voltage drops from its value at point 34 through voltage change $\Delta V$ to the device voltage corresponding to point 35. The suddenly increased current $I_D$ causes junction 22 to emit light as well as to turn the device on so that it remains at point 35 after light is removed. When voltage 36 was −2.7 volts and circuit resistance R was 14 ohms, a demonstration diode exhibited (a) a high voltage (2.7 v.) lower current (0.5 mA) state with little light output (less than 0.01 milliwatt) and (b) a lower voltage (1.3 v.) higher current state (100 mA) with appreciable light output (1 milliwatt). A 3 microwatt light input signal 16 was sufficient to cause a 100 microwatt light signal to be coupled into output fiber 15 (a gain of 15 dB) along with a 1.4 volt signal $\Delta V$ into the external electrical circuit.

It is clear then that device 1 of FIG. 1 with the S-shaped characteristic curve of FIG. 3 can operate as a light-activated light-emitting amplifier device having a substantially unidirectional optical characteristic. When more complex electrical control circuitry is utilized with the devices of the invention, considerations of load line 33 must be replaced with a circuit analysis which can show more complex travel of permissible operating points on the characteristic curve diagram of FIG. 3.

Before discussing these more complex circuits, some alternative embodiments of the inventive device are suggested. For instance, in FIG. 1 there is ample room in well 13 for coupling more than one optical fiber 14 to the light sensitive area 25 and more than one optical fiber 15 to the light-emissive area 11A of junction 22. Also, since volume 11 radiates in many directions, one or more output fiber ends may be located, for example, in the plane of junction 22 and perpendicular to the end of fiber 14. In such a case, the InP layers 4 and 7 efficiently guide a portion of the light emitted from volume 11 in an effective area 11B to an edge coupled optical output fiber (not shown).

Figure 4:
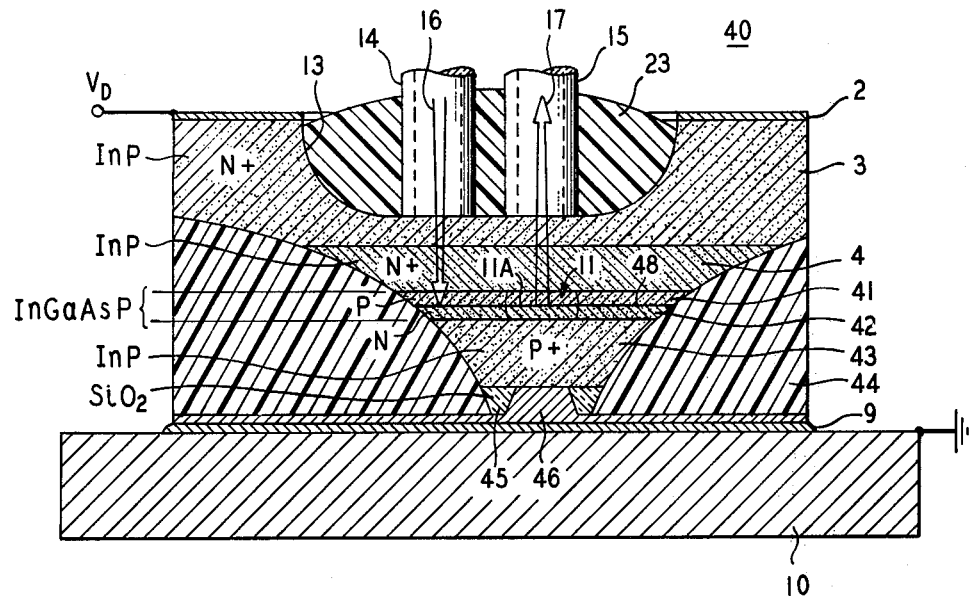
FIG. 4 shows a 200× magnified cross-sectional front view of a unidirectional optical device according to the invention having a mesa construction for reduced junction capacitance and wider bandwidth operation. As in FIG. 1 the magnification is about 20 times greater in the vertical direction for clarity.

FIG. 4 shows the device of FIG. 1 modified by mesa etching for reduced junction capacitance and hence, faster device switching speeds. After deposition of silica layer 45, but prior to definition and deposition of dot contact 46, the region exterior to the intended contact 46 area of FIG. 4 is defined for etching and is subsequently etched away forming a mesa. The etched zone is subsequently filled in with insulating varnish 44. All of the layers of device 40, however, are identical in thickness with those of device 1 of FIG. 1. InP layer 4, of FIG. 1 and InGaAsP layers 5 and 6 are very substantially etched away to yield mesa InGaAsP layers 41 and 42 of considerably smaller area, hence considerably smaller capacitance. InP layer 7 and silica layer 8 of FIG. 1 are also etched substantially to form layers 43 and 45 of FIG. 4. Dot contact 46 is subsequently provided in the usual manner.

Figure 5:
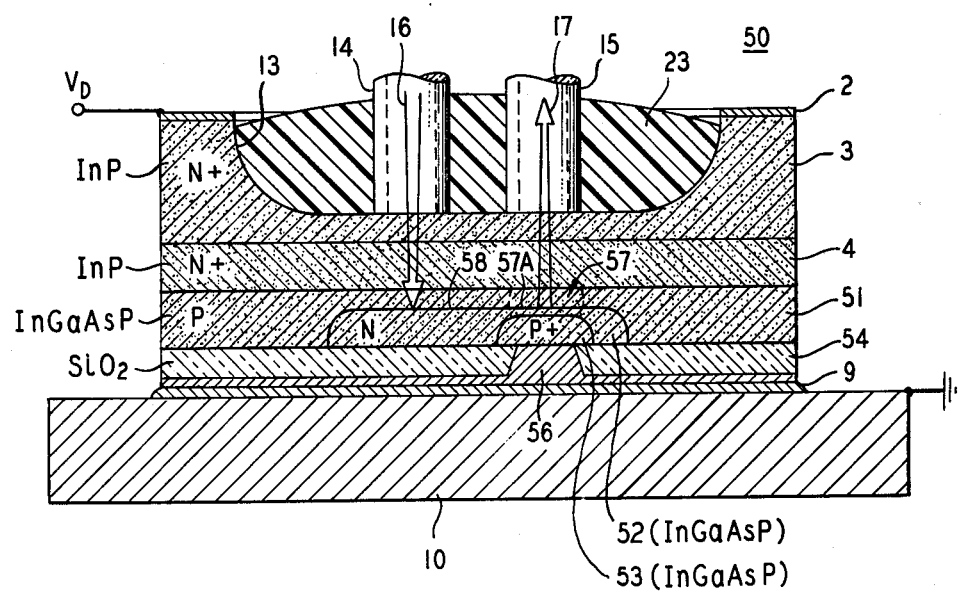
FIG. 5 shows a 200× magnified cross-sectional front view of a unidirectional optical device according to the invention having a low-capacitance junction construction resulting from masking and diffusion operations. As in FIG. 1 the magnification is about 20 times greater in the vertical direction for clarity.

FIG. 5 shows a cross-section of an alternative reduced-capacitance device 50 of the present invention which again has contact 2, InP substrate 3, and InP buffer layer 4 with 2.8 microns thickness. Now, however, an InGaAsP layer 51 p-doped with zinc to a carrier concentration of $2\times10^{16}$ is LPE grown to a thickness of 2.7 microns. Next, an area of said layer 51 is defined using a silicon nitride ($Si_4N_3$) or silica ($SiO_2$) mask so as to have a width accessible by both optical fibers as shown. Sulfur dopant is deposited and diffused from a source of aluminum sulfide ($Al_2S_3$) in the temperature range 500 degrees C.–1100 degrees C. for at least one hour so as to form n-type InGaAsP layer 52 to a depth of 1.7 microns with a carrier concentration of about $1\times10^{17}$ at its interface 58 with p-layer 51. Compare "Donor Diffusion into Gallium Arsenide from Group VI Compounds" by R. G. Frieser, *Journal of the Electrochemical Society*, Vol. 112, No. 7, 1965, p. 697. Next, an even smaller area of the previously defined InGaAsP layer 52 is defined using a silicon nitride or silica mask and diffused with zinc from a zinc phosphide ($Zn_3P_2$) source at 500 degrees C. for between 30 minutes and 1 hour so as to form a P+ InGaAsP layer 53 having a thickness of 1.5 microns and a carrier concentration of $1\times10^{18}$. The result is that a light-emitting region 57A is created so as to be optimally separated by 1 micron from layer 4 and by 0.2 micron from layer 53. Then in the conventional way silica layer 54 is deposited followed by dot contact 56.

Light 16 arriving in input fiber 14 activates junction 58 which causes the device to rapidly switch and cause light emission from volume 57. The switching is rapid because of the low capacitance of the device. The output light 17 is coupled to output fiber 15 and hardly coupled at all to fiber 14, in accordance with the optically unidirectional function of the inventive embodiment.

FIG. 6 shows a light-activated, light-emitting device 60 which is identical in construction with that of FIG. 1, when InGaAsP technology is used, with the exception that not one but two wells 78 and 79 are used for the fibers 71 and 72 which are adhesively affixed therein with epoxy 75 and 76. This permits electric current 69 leaving dot contact 68 to flow on either side of fiber 72 alone, thereby resulting in reduced $I^2R$ joule heating, more perfectly defining the light-emitting junction area 70A and more completely reducing the portion of light 74 fed back into input fiber 71. Thus, input light 73 activates the p-n junction 77 including light-emitting volume 70 and in turn, light-emitting volume 70 produces light 74 which passes into output fiber 72 alone with high coupling efficiency.

It will be understood that the invention may be practiced in a variety of material systems and, indeed, only requires that in the material there be a light activable active region which is light emissive over a smaller area or portion thereof. This principle of the invention comprehends a variety of materials technologies including those of semiconductor p-n junctions. Among other semiconductor materials for making p-n junctions, the gallium arsenide (GaAs)-aluminum gallium arsenide (AlGaAs) system is perhaps most familiar. Device 60 is alternatively fabricated in that material system according to the following description, with layer thicknesses the same as those in device 1 of FIG. 1.

N+ substrate 62 is a GaAs substrate with the [100] crystalline orientation doped to a carrier concentration of $1 \times 10^{19}$ with silicon (Si). Buffer layer 63 is $Al_{.25}Ga_{.75}$ As doped N+ to a carrier concentration of $1 \times 10^{18}$ with tellurium (Te). Active layer 64 is GaAs doped p-type to a carrier concentration of about $1 \times 10^{17}$ with germanium (Ge). Active layer 65 is GaAs doped n-type to a carrier concentration of $2 \times 10^{17}$ with tellurium (Te). Layer 66 is $Al_{0.25}G_{0.75}As$ doped P+ to a carrier concentration of approximately $2 \times 10^{18}$ with germanium (Ge). Layer 67 is silica as before and dot contact 68 is provided in the usual manner. Indium solder 9 bonds device 60 to heatsink 10, and contacting is made to electrode 61 and heatsink 10. Standard liquid phase epitaxial techniques are used in depositing the III-V layers. Various materials modifications, such as addition of antimony (Sb) or indium (In) to lower the bandgap, are employed in alternative embodiments.

FIG. 7 shows how the device of FIG. 1, and analogously the devices of FIGS. 4, 5 and 6, are incorporated as part of inventive optical pulse regenerator 80 including device 1 and electrical reset control circuit 81 connected to electrodes 2 and 12 of device 1. A distorted weakened pulse 90 enters fiber 14 as activating light 16. By a synergistic cooperation of device 1 and the reset control circuit 81 an amplified time-shortened regenerated pulse 97 is produced as output light 17 from fiber 15. Reset control circuit 81 has a source 82 of negative voltage V producing a current $I_R$ in resistor 83 which has resistance R. Resistor 83 is in turn connected to grounded capacitor 84 having capacitance C and also to inductor 85 having inductance L. Inductor 85 is wired in series with device 1, which is grounded through heatsink 10.

Figure 8:
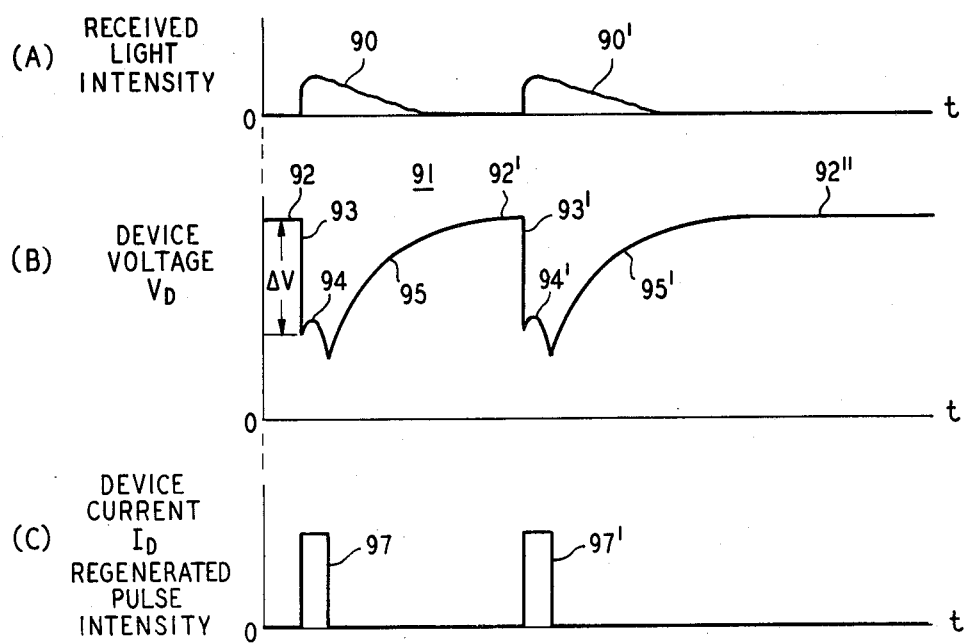
FIG. 8 shows graphs of device operating voltage vs. time correlated with received light intensity, device current, and regenerated pulse intensity vs. time.

When device 1 is at a high bias voltage $V_D$ and low current $I_D$ prior to the onset of pulse 90, capacitor C is charged to a relatively high voltage as shown by line 92 in the device voltage curve of the timing diagram of FIG. 8. The voltage level corresponding to line 92 is equivalent to operating point 34 in FIG. 3. Then, pulse 90 activates device 1 causing the production of a light pulse 97 simultaneously with a sudden voltage drop $\Delta V$ indicated by line segment 93. The LC circuit 84, 85 of FIG. 7 begins to "ring" as suggested by current loop 86 and voltage curve segment 94 of FIG. 8. This ringing causes the voltage across the device 1 to drop to a level more than $\Delta V$ lower than voltage level 92, thereby causing the device to return to its high resistance state, in turn causing a termination of the output light pulse 97.

The cooperating device 1 and control circuit 81 are thus operable together so that a pulse of the activating light 90 results in device emission for a time period limited by the turnoff condition 95 terminating voltage curve segment 94. The time period of segment 94 has duration $$T_p = \pi \sqrt{LC}. \tag{1}$$

The maximum current $I_{max}$ and hence light output is determined by the ratio of C and L such that $$I_{max} \leq 0.5 \Delta V \sqrt{C/L}. \tag{2}$$

Thus, in a design procedure C and L can be determined from the device voltage drop after triggering, $\Delta V$, the desired maximum current $I_{max}$, and the regenerated pulse length $T_p$.

If the external circuit resistance R is large enough, then after the high current pulse the diode (and the capacitor C) will have a voltage across it which is less than the bias voltage 92 by more than $\Delta V$. (See end of curve segment 94.) The capacitor C then charges up (curve segment 95) to the bias voltage 92 through resistor R with a time constant approximately equal to RC. The device 1 is insensitive to light input signals 90 until the voltage across C is once again close to the bias voltage 92. This is why the illustratively 500 $\mu s$ light input pulses shown in FIG. 8 trigger only one 60 $\mu s$ output pulse. At the end of the 500 $\mu s$ input light pulse the voltage on the diode is still a few tenths of a volt below threshold.

To increase the duty cycle it is necessary to reduce the external resistance R since both the output pulse duration and the recovery time constant are proportional to C (for a fixed $I_{max}$). However, if R is less than a critical value, which is approximately 5.4 $\Delta V/I_{max}$, the device will oscillate after it is triggered or will go to a stable high-current state. Our analysis shows that the maximum duty cycle, $D_{max}$, depends on the properties of the p-n-p-n device including its negative resistance $R_n$ such that $$D_{max} \doteq 1/(1 + kR_N I_{max}/\Delta V) \tag{3}$$

where k is a constant about equal to 0.5. To a better degree of approximation, k is the number of RC time constants to recover adequate sensitivity divided by $2\pi$. For one device used $R_N = 300\Omega$, $I_{max} = 0.05$ amp, and $\Delta V = 1.4$ V, so $D_{max} \doteq 0.16$. Typical component values are R=180 ohms, C=10 microfarads, and L=2 millihenries for 500 $\mu s$ pulse length and 16 percent duty cycle.

The initial voltage drop 93 after triggering appears instantaneous. Analysis and experiments at higher frequencies show that this drop has a time constant approximately given by the product of the device junction capacitance and the negative resistance, $R_N C_J$. For an example device of the type shown in FIG. 1, $R_N = 300$ ohms, $C_J$ is about 200 pF and $R_N C_J$ is about 60 nS. This time constant limits the example device operation to about 1 MHz. Since the center NP junction extends across the whole 400 $\mu m$ chip in device 1 while the optically active area is only 50 $\mu m$ in diameter, this capacitance can be greatly decreased with a design such as that shown in FIG. 4 or 5.

With clip leads connecting a p-n-p-n LED device 1 to a power supply, electrical oscillations at 100 MHz are observed which are presumably due to stray inductance resonating the junction capacitance. This indicates that the basic bipolar transistor action is effective up to the frequency determined by minority carrier lifetime. The LED response is measured to be 60 to 90 MHz.

During the trailing edge of pulse 90, device voltage $V_D$ on the charging curve 95 of FIG. 8 is too low to permit switching of device 1. Consequently, device current $I_D$ is low during charging curve 95. Later, when a second pulse 90' of light arrives, it too is regenerated as a pulse 97', and the device voltage $V_D$ follows the pattern 93', 94', 95'. When the presence of the input pulse 90 corresponds to a binary one, then a short binary one pulse 97 is regenerated. However, when an input pulse is absent, the device 1 is not triggered and device voltage $V_D$ stays at the high level 92".

Some reset circuits somewhat similar to circuit 81 are shown in *General Electric SCR Manual*, 5th Edition, pp. 128 and 439. However, the present invention recognizes that the device 1 in combination with an RLC reset circuit 81 can act as a unidirectional optical regenerator for producing output pulses 97 shorter than input pulses 90, and not merely act as an ordinary commutated SCR or light-activated electrical single shot circuit.

FIG. 9 is provided to illustrate an optical regenerator combination 130 having a unidirectional device 140 utilizing only a single p-n junction 151 in the light-activated light-emitting device aspect of the invention. Device 140 cooperates synergistically with its control circuit 139 to form the inventive optical regenerator 130 which is suitable for use in optical communications systems and/or in optical logic arrays.

Battery 131, resistor 132, capacitor 133 and inductor 134 form an RCL turnoff circuit similar to that of FIG. 7 for operating a silicon transistor SCR equivalent circuit shown as transistors 135 and 136 and resistors 137 and 138. When circuit 135, 136, 137 and 138 is in a high impedance state, a weak, distorted pulse 90 enters device 140 through its input fiber 141, and photons 152 impinge upon p-n junction 151 which is reverse-biased and acts as a photodetector. The carriers which are produced in device 140 at nonemitting sensitive region 155 of junction 151 increase the current in the base-emitter junction of transistors 135 and 137 thereby causing the circuit using elements 135, 136, 137 and 138 to switch on. The collector of transistor 135 rises in voltage and the collector of transistor 136 falls in voltage causing function 151 to become forward biased and current to flow through junction 151 via heatsink 150 and electrode 145. As a result, photons 153 are emitted into output fiber 142 from light-emitting volume 154. Volume 154 includes only a confined area of the junction 151 due to the small metal dot contact 149. Only at most a relatively minor proportion of the photons represented by ray 153 enter input fiber 141, rendering the device advantageously unidirectional. The LC circuit 133, 134 begins to "ring", soon shutting off circuit 135, 136, 137, 138 and light emission from device 140. As a result regeneration of pulse 90 as pulse 97 is successfully completed. Capacitor 133 is recharged by battery 131 through resistor 132, and the regenerator 130 is soon ready to regenerate another input light pulse 90.

Device 140 includes input and output optical fibers 141 and 142 adhesively affixed by epoxy 143 to well 144 in an n-type silicon (Si) doped GaAs substrate 146. A p-type layer 147 of GaAs is formed by diffusion of zinc (Zn) into the substrate 146 by standard technique. Dot contact 149 is surrounded by silica ($SiO_2$) insulation and bonded to heatsink 150. See, for instance "Small-Area High-Current-Density GaAs Electroluminescent Diodes and a Method of Operation for Improved Degradation Characteristics" by C. A. Burrus and R. W. Dawson, *Applied Physics Letters*, Vol. 17, No. 3, 1970, pages 97–99.

Regenerator 130 offers the advantage of permitting the use of silicon transistors 135 and 136 having a very low current threshold for gain turn-on, thus rendering the regenerator 130 more sensitive to light. The economic advantage of regenerator 130 compared with regenerator 80 of FIG. 7 depends on the cost of providing the extra circuit 135, 136, 137, 138 compared with the savings in increased regenerator spacing in a fiber system and in providing device 140 with its fewer layers.

As mentioned in connection with the previously disclosed devices, device 140 is also suitably fabricated in AlGaAs, InGaAsP and other materials as design considerations may dictate. Mesa or confined diffused junction approaches to lowering device capacitance are applicable. Multiple well fiber coupling is usable and multiple input and output fibers are suitably coupled to the junction 151 when desired.

In all cases, the invention contemplates a multitude of embodiments fashioned according to the principles disclosed herein by those skilled in the art so that the utility of the invention in its device, system component, and system aspects can be fully realized.

What is claimed is:

1. A light-activated light-emitting device having at least one p-n junction, electrode means to which a potential can be applied to said junction, and means for confining light emission to a volume including only a portion of said junction, characterized in that emission from said device is activable by light impinging upon said junction at a point substantially outside said portion, and said device further includes means for coupling activating light to said junction only at said point substantially outside said portion, said coupling means being directionally sensitive and oriented such that only a relatively minor portion of the light emitted from said volume is coupled into said coupling means.

2. A light-activated light-emitting device as defined in claim 1 wherein said coupling means is an optical fiber having an edge which is securely mounted to a surface of said light-emitting device.

3. A light activated light-emitting device as defined in claim 2 wherein the device further includes a second optical fiber having its edge securely mounted to said device so as to receive the maximum amount of light emission from said volume including only said portion of said junction.

4. An optical pulse regenerator comprising the light activated light-emitting device of claim 3, and an electrical control means connected to said electrode means and operable together with said device so that a pulse of said activating light results in emission only for a limited time period.

5. An optical pulse regenerator as defined in claim 4 wherein said electrical control means includes a source of potential serially connected through a resistive and inductive element to one electrode of said electrode means, and a capacitive element having one plate connected to a junction of said resistive and inductive elements and a second plate connected to a second electrode of said electrode means.

6. An optical pulse regenerator of the type defined in claim 5 wherein said inductive element is connected to said one electrode of said electrode means through a transistor SCR equivalent circuit having a pair of complementary silicon transistors.

7. A light activated light-emitting device comprising a light-emitting diode structure having means for confining the light emission to only a portion of a central junction of said structure, and further having an etched well in one surface of said structure into which an optical fiber can be securely mounted to receive the light emission from said portion of said central junction, characterized in that another optical fiber is securely mounted in said etched well and oriented such that light from this fiber is directed only to a point in said junction substantially removed from said portion which generates the light emission.

8. An optical pulse regenerator comprising the light activated light-emitting device of claim 7, and an electrical control means connected to said electrode means and operable together with said device so that a pulse of said activating light results in device emission only for a limited time period.

9. An optical pulse regenerator of the type defined in claim 8 wherein said electrical control means includes a potential source serially connected to one electrode of said electrode means through resistive and inductive elements, and said electrical control means further includes a capacitive element having one plate connected to a junction of said resistive and inductive elements and a second plate connected to a second electrode of said electrode means.

10. A light activated light-emitting device comprising a light-emitting diode structure having means for restricting the light emission to a portion of a central junction in said device, and further having an etched well into which an optical fiber can be securely mounted to receive emission from said portion, characterized in that said device further includes a second etched well into which a second optical fiber can be securely mounted to direct light energy only at a point in said junction substantially removed from the light-emitting portion of said junction.

11. An optical pulse regenerator comprising the light activated light-emitting device of claim 10, and an electrical control means connected to said electrode means and operable together with said device so that a pulse of said activating light results in device emission only for a limited time period.

12. An optical pulse regenerator of the type defined in claim 11 wherein said electrical control means includes a potential source serially connected to one electrode of said electrode means through resistive and inductive elements, and a capacitive element having one plate connected to a junction of said resistive and inductive elements and a second plate connected to a second electrode of said electrode means.

* * * * *